(12) United States Patent
Hu et al.

(10) Patent No.: US 8,717,808 B2
(45) Date of Patent: May 6, 2014

(54) MAGNETIC DEVICES AND STRUCTURES

(75) Inventors: Guohan Hu, Yorktown Heights, NY (US); Jonathan Z. Sun, Shrub Oak, NY (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 13/489,746

(22) Filed: Jun. 6, 2012

(65) Prior Publication Data

US 2012/0241885 A1 Sep. 27, 2012

Related U.S. Application Data

(63) Continuation of application No. 12/553,619, filed on Sep. 3, 2009, now Pat. No. 8,284,594.

(51) Int. Cl.
*G11C 11/00* (2006.01)

(52) U.S. Cl.
USPC ............ 365/158; 365/148; 365/171; 365/173

(58) Field of Classification Search
USPC .................................. 365/148, 158, 171, 173
See application file for complete search history.

(56) References Cited

U.S. PATENT DOCUMENTS

| | | | |
|---|---|---|---|
| 5,891,586 A * | 4/1999 | Hasegawa et al. | 428/668 |
| 7,110,287 B2 * | 9/2006 | Huai et al. | 365/171 |
| 7,217,577 B2 | 5/2007 | Horng et al. | |
| 7,230,265 B2 | 6/2007 | Kaiser et al. | |
| 7,230,290 B2 | 6/2007 | Boeve | |
| 7,285,836 B2 * | 10/2007 | Ju et al. | 257/421 |
| 7,307,876 B2 | 12/2007 | Kent et al. | |
| 2004/0134565 A1 * | 7/2004 | Sun et al. | 148/105 |
| 2007/0008661 A1 | 1/2007 | Min et al. | |
| 2007/0030728 A1 | 2/2007 | Kent et al. | |
| 2007/0184561 A1 | 8/2007 | Guo et al. | |
| 2007/0198618 A1 | 8/2007 | Kim et al. | |
| 2008/0094888 A1 | 4/2008 | Chen et al. | |
| 2008/0225585 A1 | 9/2008 | Ranjan et al. | |
| 2009/0080239 A1 | 3/2009 | Nagase et al. | |
| 2009/0279212 A1 | 11/2009 | Engel et al. | |

OTHER PUBLICATIONS

J. Herault et al., "Spin Transfer Torque Switching of Exchange Pinned TA-MRAM Cell," Intermag 2009, CF-06, pp. 49.
E. Chen et al., "Advances and Future Prospects of Non-Volatile STT-RAM," 1 page.
S. Urazhdin et al., "Effect of Polarized Current on the Magnetic State of an Antiferromagnet," The American Physical Society, Physical Review Letters, PRL 99, Jul. 2007, pp. 046602-1-046602-4.
J. McCord et al., "Tuning of Magnetization Dynamics by Ultrathin Antiferromagnetic Layers," American Institute of Physics, Applied Physics Letters, vol. 92, Apr. 2008, 3 pages.

(Continued)

*Primary Examiner* — Pho M Luu
*Assistant Examiner* — Thao Bui
(74) *Attorney, Agent, or Firm* — Vazken Alexanian; Ryan, Mason & Lewis, LLP

(57) ABSTRACT

Magnetic devices, magnetoresistive structures, and methods and techniques associated with the magnetic devices and magnetoresistive structures are presented. For example, a magnetic device is presented. The magnetic device includes a ferromagnet, an antiferromagnet coupled to the ferromagnet, and a nonmagnetic metal proximate to the ferromagnet. The antiferromagnet provides uniaxial anisotropy to the magnetic device. A resistance of the nonmagnetic metal is dependent upon a direction of a magnetic moment of the ferromagnet.

9 Claims, 5 Drawing Sheets

(56) References Cited

OTHER PUBLICATIONS

Notification of Transmittal of the International Search Report and the Written Opinion of the International Searching Authority, or the Declaration, PCT/US2010/039619 dated Aug. 19, 2010, 12 pages.

Notification Concerning Transmittal of International Preliminary Report on Patentability, PCT/US2010/039619, Mar. 15, 2012, 8 pages.

* cited by examiner

200

500

600

MAGNETIC DEVICES AND STRUCTURES

CROSS-REFERENCE TO RELATED APPLICATION

This application is a Continuation of U.S. patent application Ser. No. 12/553,619, filed on Sep. 3, 2009, the disclosure of which is fully incorporated herein by reference.

FIELD OF THE INVENTION

The present invention relates generally to magnetic devices, spintronics, memory and integrated circuits. More particularly the invention relates to magnetoresistive structures (e.g., spin torque structures) and devices including magnetoresistive random access memory (MRAM).

BACKGROUND OF THE INVENTION

Magnetoresistive random access memories (MRAMs) may combine magnetic components with standard silicon-based microelectronics to achieve non-volatile memories. For example, silicon based microelectronics include electronic devices such as transistors (e.g., field effect transistors or bipolar transistors), diodes, resistors, interconnect, capacitors or inductors. Other MRAMs may comprise magnetic components with other semiconductor components, for example, components comprising gallium arsenide (GaAs), germanium or other semiconductor material.

An MRAM memory cell comprises a magnetoresistive structure that stores a magnetic moment that is switched between two directions corresponding to two data states ("1" and "0"). In an MRAM cell, information is stored in magnetization directions of a free magnetic layer. In a conventional spin-transfer MRAM memory cell, the data state is programmed to a "1" or to a "0" by forcing a write current directly through the stack of layers of materials that make up the MRAM cell. Generally speaking, the write current, which is spin polarized by passing through one layer, exerts a spin torque on a subsequent free magnetic layer. The torque switches the magnetization of the free magnetic layer between two stable states depending upon the polarity of the write current.

SUMMARY OF THE INVENTION

Principles of the invention provide, for example, magnetic devices, and techniques and methods associated with magnetic devices.

For example, in accordance with one embodiment of the invention, a magnetic device is presented. The magnetic device includes a ferromagnet, an antiferromagnet coupled to the ferromagnet, and a nonmagnetic metal proximate to the ferromagnet. The antiferromagnet provides uniaxial anisotropy to the magnetic device. A resistance of the nonmagnetic metal is dependent upon a direction of a magnetic moment of the ferromagnet.

In accordance with another embodiment of the invention, a magnetoresistive structure is presented. The magnetoresistive structure comprises a ferromagnetic layer and an antiferromagnetic layer coupled to the ferromagnetic layer. A free side of the magnetoresistive structure includes the ferromagnetic layer and the antiferromagnetic layer. The magnetoresistive structure further comprises a pinned layer and a nonmagnetic metallic layer at least partly between the free side and the pinned layer. The antiferromagnetic layer provides uniaxial anisotropy to the free side. A resistance of the nonmagnetic metallic layer is dependent upon a direction of a magnetic moment of the ferromagnetic layer.

In accordance with an additional embodiment of the invention, a magnetoresistive memory device is presented. The magnetoresistive memory device includes the above magnetoresistive structure and stores at least two data states corresponding to at least two directions of a magnetic moment.

In accordance with yet another embodiment of the invention, an integrated circuit is presented. The integrated circuit includes the above magnetoresistive structure and a substrate on which the pinned layer, the nonmagnetic metallic layer, the ferromagnetic layer and the ferrimagnetic layer are formed.

In accordance with another additional embodiment of the invention, a method for forming a magnetoresistive structure is presented. The method includes forming a ferromagnetic layer and an antiferromagnetic layer coupled to the ferromagnetic layer. A free side of the magnetoresistive structure comprises the ferromagnetic layer and the antiferromagnetic layer. The method further includes forming a pinned layer and a nonmagnetic metallic layer at least partly between the free side and the pinned layer. The antiferromagnetic layer provides uniaxial anisotropy to the free side. A resistance of the nonmagnetic metallic layer is dependent upon a direction of a magnetic moment of the ferromagnetic layer.

Compared to conventional spin-torque switched magnetoresistive devices, aspects of the invention reduce switching current and/or increase switching speed. An antiferromagnet provides additional anisotropy to magnetic devices, for example, a free side antiferromagnetic layer provides additional uniaxial anisotropy to magnetoresistive devices enabling faster switching and/or lower switching currents.

These and other features, objects and advantages of the present invention will become apparent from the following detailed description of illustrative embodiments thereof, which is to be read in connection with the accompanying drawings.

DETAILED DESCRIPTION OF THE INVENTION

Figure 1:
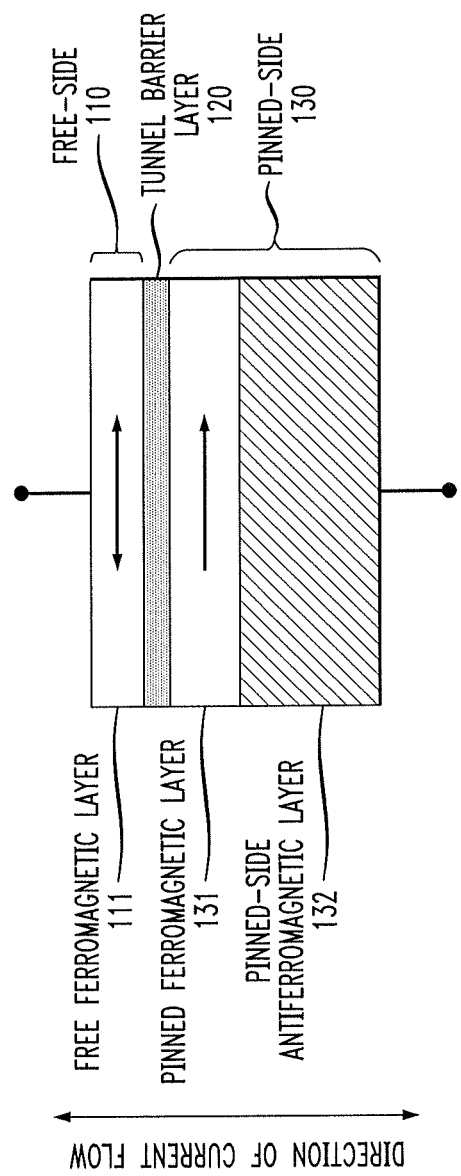
FIG. 1 illustrates a spin-torque magnetoresistive structure.

Principles of the present invention will be described herein in the context of exemplary magnetic, magnetoresistive and spin-torque switched devices and method for forming and use of such device. It is to be understood, however, that the techniques of the present invention are not limited to the devices and method shown and described herein. Rather embodiments of the invention are directed to techniques for providing uniaxial anisotropy to magnetic devices, and to techniques for reducing switching current and/or increasing switching speed in spin-torque switched devices. Although embodiments of the invention may be fabricated in or upon a silicon wafer, embodiments of the invention can alternatively be fabricated in or upon wafers comprising other materials, including but not limited to gallium arsenide (GaAs), indium phosphide (InP), etc. Although embodiments of the invention may be fabricated using the materials described below, alternate embodiments may be fabricated using other materials. The drawings are not drawn to scale. Thicknesses of various layers depicted by the drawings are not necessarily indicative of thicknesses of the layers of embodiments of the invention. For the purposes of clarity, some commonly used layers, well known in the art, have not been illustrated in at least some of the drawings of FIGS. 1-4, including, but not limited to, metal contacting layers, protective cap layers, seed layers, and an underlying substrate. The substrate may be a semiconductor substrate, such as silicon, or any other suitable structure.

The term magnetic device, as used herein, is a device that comprises a magnet. A magnet may be, for example, a ferromagnet, an antiferromagnet, or a nanomagnet. A ferromagnetic layer is an example of a ferromagnet. An antiferromagnetic layer is an example of an antiferromagnet. Examples of magnetic devices include, but are not limited to, a magnetic tunnel junction, a magnetoresistive structure, a magnetoresistive random access memory, a spin-torque-switched device and a spin-valve.

Ferromagnetic materials exhibit parallel alignment of atomic magnetic moments resulting in relatively large net magnetization even in the absence of a magnetic field. The parallel alignment effect only occurs at temperatures below a certain critical temperature, called the Curie temperature. In ferromagnets, two nearby magnetic dipoles tend to align in the same direction because of the Pauli principle: two electrons with the same spin cannot also have the same "position", which effectively reduces the energy of their electrostatic interaction compared to electrons with opposite spin.

The atomic magnetic moments in ferromagnetic materials exhibit very strong interactions produced by electronic exchange forces and result in a parallel or anti-parallel alignment of atomic magnetic moments. Exchange forces can be very large, for example, equivalent to a field on the order of 1000 Tesla. The exchange force is a quantum mechanical phenomenon due to the relative orientation of the spins of two electrons. The elements iron (Fe), nickel Ni, and cobalt (Co) and many of their alloys are typical ferromagnetic materials. Two distinct characteristics of ferromagnetic materials are their spontaneous magnetization and the existence of magnetic ordering temperatures (i.e., Curie temperatures). Even though electronic exchange forces in ferromagnets are very large, thermal energy eventually overcomes the exchange and produces a randomizing effect. This occurs at a particular temperature called the Curie temperature ($T_c$). Below the Curie temperature, the ferromagnet is ordered and above it, disordered. The saturation magnetization goes to zero at the Curie temperature.

Antiferromagnetic materials are materials having magnetic moments of atoms or molecules, usually related to the spins of electrons, align in a regular pattern with neighboring spins, on different sublattices, pointing in opposite directions. Generally, antiferromagnetic order may exist at sufficiently low temperatures, vanishing at and above a certain temperature, the Néel temperature. Above the Néel temperature, the material is typically paramagnetic. When no external magnetic field is applied, the antiferromagnetic material corresponds to a vanishing total magnetization. In a magnetic field, ferrimagnetic-like behavior may be displayed in the antiferromagnetic phase, with the absolute value of one of the sublattice magnetizations differing from that of the other sublattice, resulting in a nonzero net magnetization.

Antiferromagnets can couple (e.g., exchange-couple) to ferromagnets, for instance, through a mechanism known as exchange anisotropy (for, example, when a ferromagnetic film is either grown upon the antiferromagnet or annealed in an aligning magnetic field) causing the surface atoms of the ferromagnet to align with the surface atoms of the antiferromagnet. This provides the ability to pin the orientation of a ferromagnetic film. The temperature at or above which an antiferromagnetic layer loses its ability to pin the magnetization direction of an adjacent ferromagnetic layer is called the blocking temperature of that layer and is usually lower than the Néel temperature.

Saturation magnetization ($M_s$) of a magnetic material is the magnetic field of the magnetic material wherein an increase in an externally applied magnetic field H does not significantly increase the magnetization (i.e., magnetic field B of the magnetic material) of the magnetic material further, so the total magnetic field B of the magnetic material levels off Saturation magnetization is a characteristic particularly of ferromagnetic materials. In fact, above saturation, the magnetic field B continues increasing, but at the paramagnetic rate, which can be, for example, 3 orders of magnitude smaller than the ferromagnetic rate seen below saturation.

A nanomagnet is a sub-micrometric system that presents spontaneous magnetic order (magnetization) at a zero applied magnetic field. The small size of nanomagnets typically prevents the formation of magnetic domains. The magnetization dynamics of sufficiently small nanomagnets at low temperatures, typically single-molecule magnets, presents quantum phenomena such as macroscopic spin tunneling. At higher temperatures the magnetization undergoes random thermal fluctuations (superparamagnetism) which can, for example, limit the use of nanomagnets for permanent information storage. Examples of nanomagnets include grains of ferromagnetic metals (e.g., iron, cobalt, and nickel) and single-molecule magnets. Some nanomagnets comprise transition metal (e.g., titanium, vanadium, chromium, manganese, iron, cobalt or nickel) or rare earth (e.g., gadolinium, europium or erbium) magnetic atoms. Nano magnets can be formed, for example, as magnetic layers such as ferromagnetic layers and antiferromagnetic layers.

Magnetic anisotropy is the direction dependence of magnetic properties of a material. A magnetically isotropic material has no preferential direction for a magnetic moment of the material in a zero magnetic field, while a magnetically anisotropic material will tend to align its moment to an easy axis. There are different sources of magnetic anisotropy, for example: magnetocrystalline anisotropy, wherein the atomic structure of a crystal introduces preferential directions for the magnetization; shape anisotropy, when a particle is not perfectly spherical, the demagnetizing field will not be equal for all directions, creating one or more easy axes; stress anisotropy, wherein tension may alter magnetic behavior, leading to magnetic anisotropy; uniaxial anisotropy, that is, anisotropy along a single axis (e.g., a single easy axis); and exchange anisotropy that occurs when antiferromagnetic and ferromagnetic materials interact. The Anisotropy field ($H_k$) may be defined as the weakest magnetic field which is capable of switching the magnetization of the material from the easy axis. In multilayer structures, the effective magnetic anisotropy energy can be phenomenologically split into two components, a volume component (volume anisotropy) and an interface contribution.

Giant magnetoresistance (GMR) is a quantum mechanical magnetoresistance effect observed in certain structures, for example, structures comprising two magnetic layers (e.g. ferromagnetic or ferrimagnetic layers) with a nonmagnetic layer between the two magnetic layers. The magnetoresistance effect manifests itself as a significantly lower electrical resistance of the nonmagnetic layer, due to relatively little magnetic scattering, when the magnetizations of the two magnetic layers are parallel. The magnetizations of the two magnetic layers may be made parallel by, for example, placing the structure within an external magnetic field. The magnetoresistance effect further manifests itself as a significantly higher electrical resistance of the nonmagnetic layer, due to relatively high magnetic scattering, when the magnetizations of the two magnetic layers are anti-parallel. Because of an antiferromagnetic coupling between the two magnetic layers, the magnetizations of the two magnetic layers are anti-parallel when the structure is not at least partially within an external magnetic field.

The term nonmagnetic metal, as used herein, means a metal that is not magnetic including not ferromagnetic and not antiferromagnetic.

Tunnel magnetoresistance (TMR) is a magnetoresistive effect that occurs in magnetic tunnel junctions (MTJs). A MTJ is a component consisting of two magnets separated by a thin insulator. If the insulating layer is thin enough (typically a few nanometers), electrons can tunnel from one magnet into the other. Since this process is forbidden in classical physics, TMR is a strictly quantum mechanical phenomenon.

The term proximate or proximate to, as used herein, has meaning inclusive of, but not limited to, abutting, in contact with, and operatively in contact with. In particular and with respect to magnetic coupling, proximate or proximate to includes, but is not limited to, being operatively magnetically coupled. The term abut(s) or abutting, as used herein, has meaning that includes, but is not limited to, being proximate to.

A spin-transfer-switched device is a device that includes a two terminal magnetic junction that can be switched by passing an electric current through the spin-transfer-switched device. A spin-transfer-switched device is a spin-torque structure and may be, for example, a magnetoresistive structure or device. The magnetic junction is either a tunnel junction or a spin-valve. The electric current becomes spin-polarized in the spin-transfer-switched device. Conservation of spin-angular momentum is a mechanism behind a current-driven magnetic reversal process. In the spin-transfer-switched device there are usually two magnetic layers separated by a barrier layer such as a tunnel barrier layer or a conducting nonmagnetic barrier layer. One of the magnetic layers is "fixed" by its relatively large layer thickness or by exchange-coupled magnetic pinning. The other magnetic layer (i.e., free magnetic layer) is free or rotatable. The free layer usually has at least two stable magnetic directions. For digital applications the two stable magnetic directions correspond to "0" and "1" data states. A switch between the two stable magnetic directions can be accomplished by driving the junction with a current exceeding a certain switching threshold-current, Ic. The direction of the current determines which of the two stable magnetic directions the final state becomes. The spin-transfer-switched device is, for example, formed with a lateral size at or below 100 nanometers (nm). A spin-transfer-switched device with a lateral size well below 100 nm is more operationally efficient that a spin-transfer-switched device having a lateral size above 100 nm. The spin-transfer-switched device could extend magnetoresistive random access memory (MRAM) into the fabrication technologies having dimensions of thirty-two nanometers and below.

It is desirable to reduce the switching threshold-current, Ic, and to switch between the stable magnetic directions (i.e., magnetic reversal) as fast as possible. Lowering Ic and faster switching may be accomplished by, for example, reducing saturation magnetization of a free-side. A low magnetic moment of the free-side allows for fast switching because spin torque induced switching conserves angular momentum, and magnetic moment is proportional to the angular momentum. Electrons have spin-angular momentum. The lower the total magnetic moment of the free-side, the less spin-angular momentum needed to induce switching and, therefore, the fewer the electrons needed to induce switching In this way, Ic is reduced and, for a given switching current, switching occurs faster.

A free-side comprising a material having a low saturation magnetic moment also reduces Ic because Ic is determined, at least in part, by a total anisotropy field of the free-side. For a thin film structured free-side, the total anisotropy field of the free-side is usually dominated by a thin film shape-related easy-plane anisotropy field having a saturation magnetization 4\pi Ms that could be well into many kilo-oersteds. A reduction of Ms causes a reduction of Ic.

However, for commonly used simple ferromagnetic materials, such as thin films comprising an alloy comprising cobalt and iron (CoFe) or an alloy comprising cobalt, iron and boron (B) (i.e., CoFeB), there is a limit to the reduction of Ms because, for commonly used simple ferromagnetic materials, the intrinsic magnetic anisotropy is minimal and/or uncontrolled. The uniaxial anisotropy necessary for maintaining thermal stability of a nanomagnet, with respect to the data state stored within the nanomagnet, is controlled mostly by the shape demagnetization of the nanomagnet, which requires a sizeable Ms. The use of shape-controlled magnetic anisotropy in thin films also results in a very large easy-plane anisotropy which amounts to an anisotropy field having a saturation magnetization 4\pi Ms that could be well into many kilo-oersteds for the commonly used simple ferromagnetic materials. This easy-plane anisotropy is what currently limiting the further reduction of Ic.

The requirement for reducing Ms, in order to reduce Ic, is therefore in competition with the requirement of good thermal stability for data retention. Good thermal stability for data retention usually requires the uniaxial anisotropy to be, for example, 40 kilo-telsa (kT) to 60 kT in order to ensure ten year data retention.

The choice of free-side materials at the barrier layer to free-side interface is limited because of the required magnetotransport properties (e.g., large magnetoresistance and appropriate resistance-area product) of the junction comprising the barrier layer. The magnetotransport properties also, at least in part, determine the efficiency of the spin-transfer-switched device and the value of Ic.

Therefore, it is desirable to have a free-side that: i) derives uniaxial anisotropy from sources other than shape, ii) keeps the total magnetic moment, and therefore Ms, at a minimum, and iii) preserves the spin-polarization properties at the barrier layer to free-side interface in order to maximize the efficiency of spin-torque switching (e.g., maximum switching speed, minimum switching current).

An aspect of the invention is that the intrinsic anisotropy energy of a thin antiferromagnet, for example, a thin antiferromagnetic layer (AFML), provides additional uniaxial anisotropy to a thin ferromagnet for example, a thin ferromagnetic layer (FML). The thin antiferromagnet and the thin ferromagnet may be a nano-structured antiferromagnet (i.e., a nanoantiferromagnet) and a nano-structured ferromagnet (i.e., a nanoferromagnet), respectively. A magnetic device comprising the AFML (antiferromagnet) and the FML (ferromagnet), for example as a bi-layer, is provided with uniaxial anisotropy by the AFML.

A corresponding embodiment of the invention is a spin-torque-switchable magnetic tunnel junction (MTJ) device comprises the thin FML and the thin AFML within a composite free-side structure of the device. The composite free-side structure, comprising the ferromagnet and the antiferromagnet, may be considered a composite nanomagnet, a composite thin-film structure, and a by-layer. The FML is strongly exchange-coupled to the AFML. Both the FML and the AFML are formed to have substantially the same laterally dimensions, for example, less than one hundred and twenty nanometers. The volume anisotropy of the AFML provides additional thermal activation barrier height for the composite free-side structure. The additional thermal activation barrier height is limited by the exchange coupling energy between the FM and AFM.

The thin FML comprises a high-spin-polarization ferromagnetic material, for example, iron (Fe) or an alloy of iron and cobalt (FeCo). The thin AFML comprises, for example, an alloy of iridium and Manganese (IrMn). Fe is adapted for interfacing with a (100) magnesium oxide (MgO) tunnel barrier.

FIG. 1 illustrates a spin-torque structure 100. The spin-torque structure 100 may be, at least part of, a spin-torque transfer magnetoresistive structure or spin-torque magnetoresistive random access memory (MRAM) having two terminals. The spin-torque structure 100 comprises a free-side 110 comprising a free ferromagnetic layer 111, tunnel barrier layer 120, and pinned-side 130 comprising a pinned ferromagnetic layer 131 and a pinned-side antiferromagnetic layer 132. A magnetic tunnel junction comprises the tunnel barrier layer 120 between the free-side 110 and the pinned-side 130. The direction of the magnetic moment of the pinned ferromagnetic layer 131 is fixed in direction (e.g., pointing to the right) by the pinned-side antiferromagnetic layer 132. A current, exceeding a switching threshold-current Ic, passed down through the tunnel junction makes magnetization of the free ferromagnetic layer 111 parallel to the magnetization of the pinned ferromagnetic layer 131, e.g., pointing to the right (down is in the vertical direction from the top to the bottom of FIG. 1). A current, exceeding Ic, passed up through the tunnel junction makes the magnetization of the free ferromagnetic layer 111 anti-parallel to the magnetization of the pinned ferromagnetic layer 131, e.g., pointing to the left. A smaller current, less Ic, through the device 100, passing up or passing down, is used to read the resistance of the device 100, which depends on the relative orientations of the magnetizations of the free ferromagnetic layer 111 and the pinned ferromagnetic layer 131. The smaller current is not intended to change, and should be small enough so that it does not change, the magnetization of the free ferromagnetic layer 111.

Figure 2:
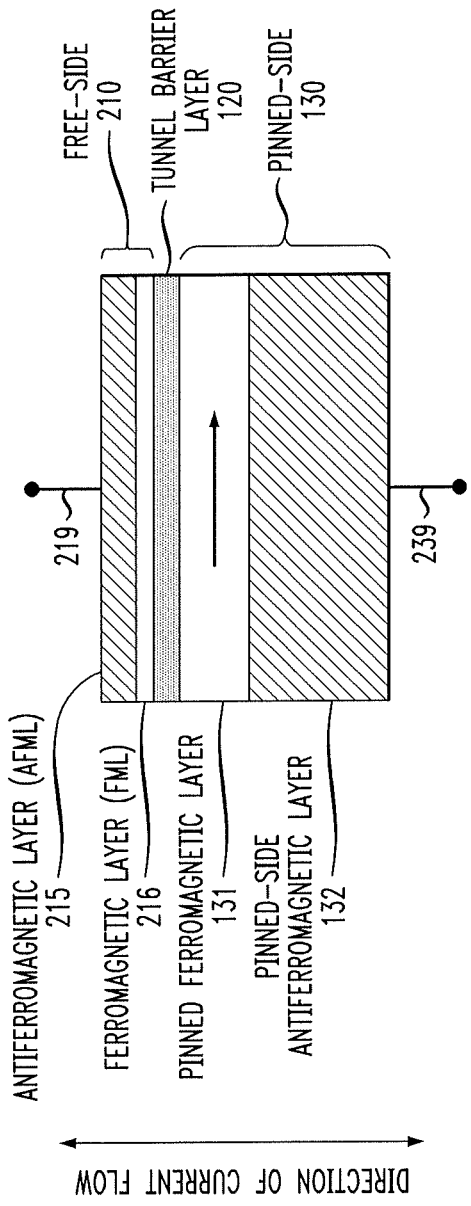
FIG. 2 illustrates a spin-torque structure comprising a free-side bilayer, according to an embodiment of the present invention.

FIG. 2 illustrates a spin-torque structure 200 comprising a free-side bilayer, according to an embodiment of the present invention. The spin-torque structure 200 may be, for example, a spin-transfer-switched device. The spin-torque structure 200 comprises an MgO tunnel barrier layer 120 and a pinned-side 130 comprising a pinned-side antiferromagnetic layer 132 and a pinned ferrimagnetic layer 131.

The spin-torque structure 200 further comprises a free side 210 comprising a FML 216 and an AFML 215. The FML 216 is exchange-coupled to the AFML 215. The FML 216 is in direct contact with (e.g., abuts, is proximate to) the AFML 215 and with the tunnel barrier layer 120. The pinned ferromagnetic layer 131 abuts the tunnel barrier layer 120 and the pinned-side antiferromagnetic layer 132.

Alternately, the spin-torque structure 200 may comprise a metallic spacer layer in place of the tunnel barrier layer 120. The spin-torque structure comprising the metallic spacer layer exhibits giant magnetoresistance as previously described. The resistance of the nonmagnetic metallic layer depends upon the relative orientation of the two abutting or proximate layers, i.e., the pinned ferrimagnetic layer 131 and the FML 216. A first resistance of the nonmagnetic metallic layer corresponds to the direction of the magnetic moment of the FML 216 being parallel to a direction of a magnetic moment of the pinned ferromagnetic layer 131, and a second resistance of the nonmagnetic metallic layer corresponds to the direction of the magnetic moment of the FML 216 being anti-parallel to the direction of the magnetic moment of the pinned ferromagnetic layer 131. Resulting from the giant magnetoresistance effect, the first resistance is lower than the second resistance.

As an example, in the spin-torque structure 200, the FML 216 comprises a 5 angstrom thick layer (or between three and seven angstroms) of an alloy of iron and cobalt (FeCo) and the AFML comprises a 15 angstrom thick layer (or between ten and twenty angstroms) of IrMn. The free side may further comprise additional layers, for example, a 50 angstrom (or between thirty to seventy angstroms) thick layer of ruthenium (Ru) (not shown), a nonmagnetic transition metal, abutting the AFML 215 and a top metal layer (not shown) coupled to a top contact 219. The pinned-side 130 may further comprise additional layers, for example, a bottom metal layer (not shown) abutting the pinned-side antiferromagnetic layer 132 and coupled to a bottom contact 239. A magnetic tunnel junction (MTJ) comprises the tunnel barrier layer 120 between the pinned-side 130 and the free-side 210 (e.g., between the pinned ferrimagnetic layer 131 and the FML 216).

In the spin-torque structure 200, the FML 216 interfaces with the tunnel barrier layer 120. The function of the FML 216 interfacing with the tunnel barrier layer 120 is to provide spin-polarization in the density of state for the MTJ. The interface and the related function dictate a specific type of band-structure of the FML 216 matched to the band-structure of tunnel barrier layer 120. Consequently, the crystalline orientation and symmetry of FML 216 has to match to the crystalline orientation and symmetry of tunnel barrier layer 120. In the spin-torque structure 200, MgO of the tunnel barrier layer 120 is in a (100) texture (e.g., MgO was grown or otherwise formed in a (100) texture). The FeCo of the FML 216 is grown or otherwise formed in body-centered cubic (bcc) symmetry and grown or formed on the MgO epitaxially, thus, at least preserving a grain-to-grain epitaxial relationship of the FeCo of the FML 216 with the abutting MgO of the tunnel barrier layer 120.

The function of the AFML 215 is to provide an adequate amount of magnetic anisotropy (e.g., uniaxial magnetic anisotropy) without adding significant amounts of total magnetic moment into the composite free-side structure.

The FML 216 and the AFML 215, in the composite free-side structure, are exchange-coupled magnetically across the interface between the FML 216 and the AFML 215 (FML/AFML interface). The exchange coupling energy must be strong relative to the anisotropy energy of the AFML 215 in order to ensure coherent rotation, under spin-torque excitation, of the magnetic moments of both the FML 216 and the AFML 215. The maximum amount of uniaxial anisotropy energy the AFML 215 can provide is therefore limited by, and to the value of, the FML/AFML interface exchange coupling energy. Consequently, the exchange coupling energy of the exchange coupling between the AFML and the FML is greater than energy associated with the uniaxial anisotropy of the AFML.

Figure 3:
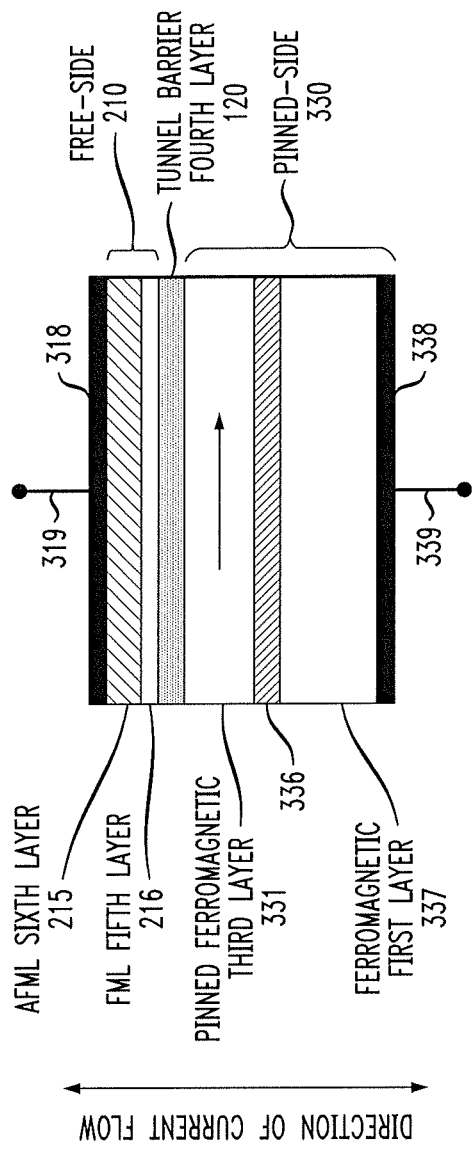
FIG. 3 illustrates a spin-torque structure comprising a free-side bilayer and an alternate pinned side configuration, according to an embodiment of the present invention.

FIG. 3 illustrates a spin-torque structure 300 comprising a free-side bilayer, according to another embodiment of the invention. The spin-torque structure 300 comprises an MgO-barrier based, spin-torque-switched magnetic tunnel junction formed with lateral dimensions below, for example, 100 nm (nanometers), or less than 120 nm. The spin-torque structure 300 comprise a bottom contact 339 coupled to a bottom metal electrode 338 abutting and coupled to a ferromagnetic first layer 337 comprising CoFe, a nonmagnetic second layer 336 comprising Ru abutting the ferromagnetic first layer 337, a ferromagnetic third layer 331 comprising CoFeB abutting the nonmagnetic second layer 336, a tunnel barrier fourth layer 120 comprising MgO, abutting the ferromagnetic third layer 331, a FML 216 that is approximately five angstroms thick comprising CoFe abutting the tunnel barrier fourth layer 120, an AFML 215 that is approximately fifteen angstroms thick comprising IrMn and proximate to the FML 216, and a top contact 319 coupled to a top metal electrode 318 abutting and coupled to the AFML 215. A free-side 210 comprises the AFML 215 abutting and exchange-coupled to the FML 216. The free-side 210 is configured and functions similarly to the free-side 210 of the spin-torque structure 200 of FIG. 2. A pined side 330 comprises the ferromagnetic first layer 337, the nonmagnetic second layer 336 and the ferromagnetic third layer 331. The ferromagnetic third layer 331 is a pinned layer. The direction of the magnetic moment of the ferromagnetic third layer 331 is fixed in direction or pinned (e.g., pointing to the right), at least in part, by the ferromagnetic first layer 337.

Alternately, the spin-torque structure 300 may comprise a metallic spacer layer in place of the tunnel barrier fourth layer 120. The spin-torque structure comprising the metallic spacer layer exhibits giant magnetoresistance as previously described. The resistance of the nonmagnetic metallic layer depends upon the relative orientation of the two abutting or proximate layers, i.e., the ferrimagnetic third layer 331 and the FML 216. A first resistance of the nonmagnetic metallic layer corresponds to the direction of the magnetic moment of the FML 216 being parallel to a direction of a magnetic moment of the ferromagnetic third layer 331, and a second resistance of the nonmagnetic metallic layer corresponds to the direction of the magnetic moment of the FML 216 being anti-parallel to the direction of the magnetic moment of the ferromagnetic third layer 331. Resulting from the giant magnetoresistance effect, the first resistance is lower than the second resistance.

The tunnel barrier layer 120 may comprise, for example, MgO (e.g., a layer comprising MgO). In the embodiments shown in FIGS. 2 and 3, the tunnel barrier layer 120 is an example of a nonmagnetic spacer layer and also a tunnel junction layer. Other embodiments, having a magnetoresistance signal due to giant magnetoresistance, may include a nonmagnetic metallic layer as a nonmagnetic spacer layer in place of the tunnel barrier layer 120. Embodiments comprising the nonmagnetic metallic layer operate, for example, during reading or writing, in a similar way as embodiments comprising the tunnel barrier layer, although the underlying physics of the magnetoresistances differ between the tunnel barrier layer (tunneling magnetoresistance) and the nonmagnetic metallic layer (giant magnetoresistance). The nonmagnetic metallic layer may comprise, for example, copper (Cu), gold (Au), or Ru. Embodiments comprising the nonmagnetic metallic layer are sometimes called spin-valves.

A spin-torque device, such as an MRAM memory or MRAM memory cell, according to an embodiment of the invention comprises, for example, the spin-torque structure 200, the spin-torque structure 300 or the spin-torque structure 400. An MRAM, comprising one or more of the MRAM memory cells, may further comprise other electronic devices or structures such as electronic devices comprising silicon, a transistor, a field-effect transistor, a bipolar transistor, a metal-oxide-semiconductor transistor, a diode, a resistor, a capacitor, an inductor, another memory device, interconnect, an analog circuit and a digital circuit. Data stored within the MRAM memory cell corresponds to the direction of a magnetic moment in the FML 216 layer and/or the AFML 215 layer.

In the embodiments of FIGS. 1 and 2, the pinned side 130 comprises a pinned ferromagnetic layer 131 and a pinned-side antiferromagnetic layer 132 abutting and exchange-coupled to the pinned ferromagnetic layer 131. Although the pinned side 130 comprises the layers shown in FIGS. 1 and 2, the invention is not so limited; other arrangements of the pinned side 130 are known in the art and may be used in other embodiments of the invention.

The pinned ferromagnetic layer 131 may comprise, for example, an anti-parallel (AP) layer comprising a 2 nanometer (nm) thick layer comprising a first alloy of cobalt and iron (CoFe), a 0.8 nm ruthenium (Ru) layer, and another 2 nm thick layer comprising a second alloy of cobalt and iron (CoFe). Alternately, the pinned ferromagnetic layer 131 may comprise a simple pinned layer, for example, a 3 nm thick layer of an alloy of cobalt and iron (CoFe).

The pinned-side antiferromagnetic layer 132 is strongly exchange-coupled to the pinned ferromagnetic layer 131 pinning the pinned ferromagnetic layer 131. The pinned-side antiferromagnetic layer 132 is used to pin the pinned ferromagnetic layer 131 to a particular alignment.

The pinned-side antiferromagnetic layer 132 may comprise, for example, an alloy of manganese (Mn) such as an alloy comprising iridium and manganese (IrMn), an alloy comprising platinum and manganese (PtMn), an alloy comprising iron and manganese (FeMn), or an alloy comprising nickel and manganese (NiMn). Alternately, the pinned-side antiferromagnetic layer 132 may comprises, for example, different antiferromagnetic materials.

Figure 4:
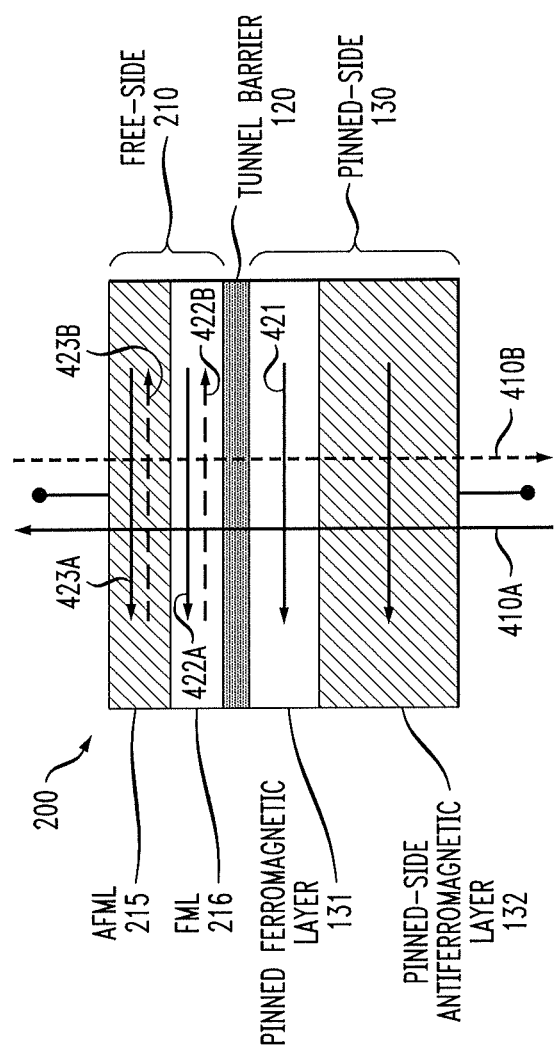
FIG. 4 illustrates writing a spin-torque structure, according to an embodiment of the present invention.

FIG. 4 shows the write operation of the spin-torque structure 400, according to an embodiment of the invention. The spin-torque structure 400 comprised the spin-torque structure 200 with a write current applied. Writing, in one case, is accomplished by an upwards write current 410A, comprising a flow of electrons driven vertically through the spin-torque structure 400. The direction of the arrows on the heavy vertical lines points in the direction of electron flow. To change the data state of the spin-torque structure 400, the write current switches the magnetic moment of the FML 216. Because the AFML 215 is strongly exchange-coupled to the FML 216, the magnetic moment of the AFML 215 is also switched. If a magnetic moment 421 of the pinned ferromagnetic layer 131 points, for example, to the left, the electrons flowing within the upwards current 410A will be spin-polarized to the left and therefore place a torque on the FML 216 to switch a magnetic moment 422A of the free FML 216 to the left. Correspondingly, due to the exchange coupling between the AFML 215 and the FML 216, a magnetic moment 423A of the AFML 215 may also be switched to the left. If the data state already corresponded to the data state that otherwise would be induced by the upwards write current 410A, the magnetic moment 422A of the FML 216 and the magnetic moment 423A of the AFML 215 were already set to the left and will not be switched by the upwards write current 410A.

Conversely, if the flow of electrons is in the opposite direction (downward) as in the downward write current 410B, the electrons will be spin-polarized to the right, and a magnetic moment 422B of the FML 216 will be switched to the right when changing the data state. Consequently, a magnetic moment 423B of the AFML 215 will also be switched to the right. If the data state already corresponded to the data state that otherwise would be induced by the downward write current 410B, the magnetic moment 422B of the FML 216 and the magnetic moment 423B of the AFML 215 were already set to the right and will not be switched by the downwards write current 410B.

The direction of the magnetic moment 421 of the pinned ferromagnetic layer 131, for example, is set using a high-temperature anneal in an applied magnetic field.

Consider reading the spin-torque structure 200. In one embodiment, a read current, less than the write current and below the switching threshold-current, k, is applied to read the resistance of the tunnel barrier layer 120. The read current is applied across the spin-torque structure 200 to flow through the spin-torque structure 200 from top to bottom or from bottom to top. The resistance of the tunnel barrier layer 120 depends on the relative magnetic orientation (direction of magnetic moment) of the FML 216. If the magnetic orientations are parallel, the resistance of the tunnel barrier layer 120 is relatively low. If the magnetic orientations are anti-parallel, the resistance of the tunnel barrier layer 120 is relatively high. As previously stated, the resistance of the tunnel barrier layer 120 is due to tunneling magnetoresistance, and the resistance of a nonmagnetic metal layer that may be used as a nonmagnetic spacer layer in place of the tunnel barrier layer 120 is due to giant magnetoresistance. Measuring the voltage across the spin-torque structure 200, corresponding to the applied read current, allows for calculation of the resistance across the spin-torque structure 200 according to ohms law. Because the resistance of the tunnel barrier layer 120 dominates the series resistance of the layers within the spin-torque structure 200, the resistance of the tunnel barrier layer 120 is obtained, to some degree of accuracy, by measuring the resistance of the spin-torque structure 200. In an alternate method of reading, a read voltage is applied across the spin-torque structure 200 and a current is measured from which the resistance of the spin-torque structure 200 is calculated.

Read and write operations of the spin-torque structure 300 are similar to the read and write operations described above for the spin-torque structure 200.

Figure 5:
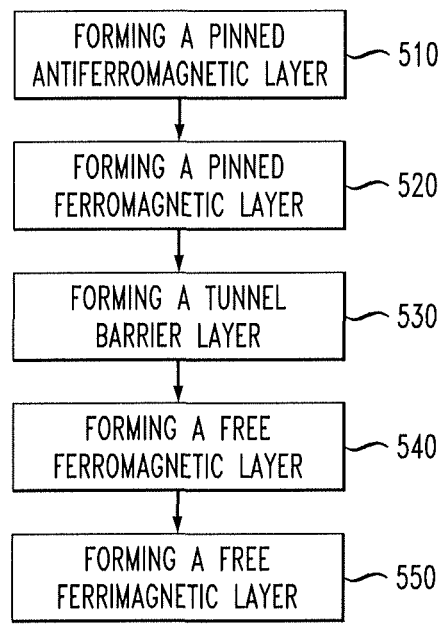
FIG. 5 illustrates a method for forming a magnetoresistive structure, according to an embodiment of the invention.

FIG. 5 illustrates a method 500 for forming a spin-torque structure, according to an embodiment of the invention. For example, the spin-torque structure comprises the spin-torque structure 200 or an MRAM memory cell. The steps of method 500 may occur in orders other than that illustrated.

The first step 510 comprises forming a pinned-side antiferromagnetic layer, for example the pinned-side antiferromagnetic layer 132.

The second step 520 comprises forming a pinned ferromagnetic layer, for example the pinned ferromagnetic layer 131. The pinned-side antiferromagnetic layer is exchange-coupled and abutting the pinned ferromagnetic layer.

The third step 530 comprises forming a tunnel barrier layer. For example, the tunnel barrier layer comprises the tunnel barrier layer 120. The tunnel barrier layer abuts the pinned ferromagnetic layer.

The fourth step 540 comprises forming a free-side ferromagnetic layer, for example, the FML 216. The free-side ferromagnetic layer abuts the tunnel barrier layer.

The fifth step 550 comprises forming a free-side antiferromagnetic layer, for example, the AML 215. The free-side antiferromagnetic layer is exchange-coupled to and abuts, or is proximate to, the free-side ferromagnetic layer.

According to an alternate method, the third step 530 comprises forming a nonmagnetic metal layer instead of the tunnel barrier layer, wherein the pinned ferromagnetic and the free-side ferromagnetic layers abuts the nonmagnetic metal layer.

According to yet another alternate method, the first step 510 and the second step 520 are replaced by an alternate step of forming a pinned side which may comprise one or more layers different from the combination of the pinned-side antiferromagnetic layer and the pinned ferromagnetic layer. For example, the alternate step may comprise forming a pinned side (e.g., the pinned-side 330) comprising a ferromagnetic layer (e.g., the ferromagnetic first layer 337), a spacer layer (e.g., the nonmagnetic spacer layer 336) and another ferromagnetic layer (e.g., the ferromagnetic third layer 331).

Figure 6:
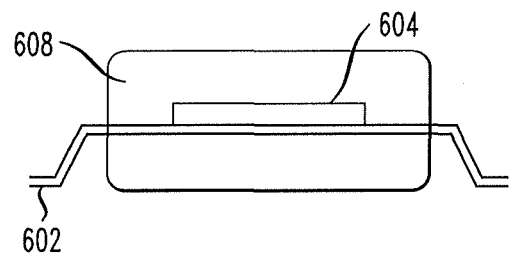
FIG. 6 is a cross-sectional view depicting an exemplary packaged integrated circuit, according to an embodiment of the present invention.

FIG. 6 is a cross-sectional view depicting an exemplary packaged integrated circuit 600 according to an embodiment of the present invention. The packaged integrated circuit 600 comprises a leadframe 602, a die 604 attached to the leadframe, and a plastic encapsulation mold 608. Although FIG. 6 shows only one type of integrated circuit package, the invention is not so limited; embodiments of the invention may comprise an integrated circuit die enclosed in any package type.

The die 604 includes a structure described herein according to embodiments of the invention and may include other structures or circuits. For example, the die 604 includes at least one magnetic device, magnetoresistive, spin-torque structure or MRAM according to embodiments of the invention, for example, the spin-torque structures 200, 300 or 400 or embodiments formed according to the method of the invention (e.g., the method of FIG. 5). For example, the other structures or circuits may comprise electronic devices comprising silicon, a transistor, a field-effect transistor, a bipolar transistor, a metal-oxide-semiconductor transistor, a diode, a resistor, a capacitor, an inductor, another memory device, interconnect, an analog circuit and a digital circuit. The spin torque structure or MRAM may be formed upon or within a semiconductor substrate, the die also comprising the substrate. Specifically, the substrate underlies, supports or is a platform upon which, the spin torque structure or MRAM is formed, for example, the pinned side 130, the tunnel barrier layer 120, the FML 216 and the AFML are formed.

An integrated circuit in accordance with the present invention can be employed in applications, hardware and/or electronic systems. Suitable hardware and systems for implementing the invention may include, but are not limited to, personal computers, communication networks, electronic commerce systems, portable communications devices (e.g., cell phones), solid-state media storage devices, functional circuitry, etc. Systems and hardware incorporating such integrated circuits are considered part of this invention. Given the teachings of the invention provided herein, one of ordinary skill in the art will be able to contemplate other implementations and applications of the techniques of the invention.

Although illustrative embodiments of the invention have been described herein with reference to the accompanying drawings, it is to be understood that the invention is not limited to those precise embodiments, and that various other changes and modifications may be made therein by one skilled in the art without departing from the scope of the appended claims.

What is claimed is:

1. A magnetic device comprising:
a ferromagnet layer;
an antiferromagnet layer coupled to the ferromagnet layer; and a nonmagnetic metal proximate to the ferromagnet layer;

wherein the antiferromagnet layer provides uniaxial anisotropy to the ferromagnet layer, wherein an exchange coupling energy between the antiferromagnet layer and the ferromagnet layer is greater than energy associated with the uniaxial anisotropy to ensure concurrent rotation of magnetic moments of both the ferromagnet layer and the antiferromagnet layer under spin-torque excitation; and wherein a resistance of the nonmagnetic metal is dependent upon a direction of the magnetic moment of the ferromagnet layer.

2. The magnetic device of claim 1, wherein a volume anisotropy of the antiferromagnet layer provides a thermal activation barrier for the magnetic device.

3. The magnetic device of claim 1, wherein the ferromagnet layer is a nanoferromagnet.

4. A magnetoresistive memory device comprising: a ferromagnetic layer; an antiferromagnetic layer coupled to the ferromagnetic layer, wherein a free side of the magnetoresistive memory device comprises the ferromagnetic layer and the antiferromagnetic layer; a pinned layer having a magnetic moment in a fixed direction; and a nonmagnetic metallic layer between the free side and the pimped layer; wherein the antiferromagnetic layer provides uniaxial anisotropy to the ferromagnetic layer of the free side, wherein an exchange coupling energy between the antiferromagnetic layer and the ferromagnetic layer is greater than energy associated with the uniaxial anisotropy to ensure concurrent rotation of magnetic moments of both the ferromagnetic layer and antiferromagnetic layer under spin-torque excitation; wherein a resistance of the nonmagnetic metallic layer is dependent upon a direction of the magnetic moment of the ferromagnetic layer in relation to the fixed direction of the magnetic moment of the pinned layer; and wherein the magnetoresistive memory device stores at least two data states corresponding to at least two directions of the magnetic moment of the ferromagnetic layer.

5. The magnetoresistive memory device of claim 4, wherein the pinned layer comprises a pinned ferromagnetic layer and a pinned-side antiferromagnetic layer exchange-coupled to the pinned ferromagnetic layer.

6. An integrated circuit comprising: a ferromagnetic layer; an antiferromagnetic layer coupled to the ferromagnetic layer, wherein the ferromagnetic layer and the antiferromagnetic layer comprise a free side of a magnetoresistive structure; a pinned layer having a magnetic moment in a fixed direction; a nonmagnetic metallic layer between the free side and the pinned layer; and a substrate on which the pinned layer, the nonmagnetic metallic layer, the ferromagnetic layer and the antiferromagnetic layer are formed; wherein the antiferromagnetic layer provides uniaxial anisotropy to the ferromagnetic layer of the free side, wherein an exchange coupling energy between the antiferromagnetic layer and the ferromagnetic layer is greater than energy associated with the uniaxial anisotropy to ensure concurrent rotation of magnetic moments of both the ferromagnetic layer and the antiferromagnetic layer under spin-toque excitation; and wherein a resistance of the nonmagnetic metallic layer is dependent upon a direction of the magnetic moment of the ferromagnetic layer in relation to the fixed direction of the magnetic moment of the pinned layer.

7. The integrated circuit of claim 6, wherein the pinned layer comprises a pinned ferromagnetic layer and a pinned-side antiferromagnetic layer exchange-coupled to the pinned ferromagnetic layer.

8. A method for forming a magnetoresistive structure, the method comprising the steps of: forming a ferromagnetic layer; forming an antiferromagnetic layer coupled to the ferromagnetic layer, wherein a free side of the magnetoresistive structure comprises the ferromagnetic layer and the antiferromagnetic layer; forming a pinned layer having a magnetic moment in a fixed direction; and forming a nonmagnetic metallic layer between the free side and the pinned layer; wherein the antiferromagnetic layer provides uniaxial anisotropy to the ferromagnetic layer of the free side, wherein an exchange coupling energy between the antiferromagnetic layer and the ferromagnetic layer is greater than energy associated with the uniaxial anisotropy to ensure concurrent rotation of magnetic moments of both the ferromagnetic layer and the antiferromagnetic layer under spin-torque excitation; and wherein a resistance of the nonmagnetic metallic layer is dependent upon a direction of a magnetic moment of the ferromagnetic layer in relation to the fixed direction of the magnetic moment of the pinned layer.

9. The method of claim 8, wherein forming the pinned layer comprises forming a pinned ferromagnetic layer and forming a pinned-side antiferromagnetic layer exchange-coupled to the pinned ferromagnetic layer.

* * * * *